United States Patent
Chen

(10) Patent No.: US 9,773,975 B1
(45) Date of Patent: Sep. 26, 2017

(54) RESISTIVE RANDOM ACCESS MEMORY

(71) Applicant: Winbond Electronics Corp., Taichung (TW)

(72) Inventor: Frederick Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/076,676

(22) Filed: Mar. 22, 2016

(51) Int. Cl.
| | |
|---|---|
| H01L 27/115 | (2017.01) |
| H01L 29/94 | (2006.01) |
| H01L 45/00 | (2006.01) |
| H01L 47/00 | (2006.01) |
| G11C 11/00 | (2006.01) |
| G11C 11/16 | (2006.01) |
| H01L 43/12 | (2006.01) |

(52) U.S. Cl.
CPC .......... *H01L 45/08* (2013.01); *H01L 45/1233* (2013.01); *H01L 45/1246* (2013.01); *H01L 45/146* (2013.01); *H01L 45/1608* (2013.01); *H01L 45/1641* (2013.01)

(58) Field of Classification Search
CPC ........ H01L 45/08; H01L 45/12; H01L 45/146
USPC .................................................... 257/2, 3, 4
See application file for complete search history.

(56) References Cited

U.S. PATENT DOCUMENTS

| | | | |
|---|---|---|---|
| 2010/0182827 A1* | 7/2010 | Kostylev | G11C 11/5678 365/163 |
| 2011/0291066 A1* | 12/2011 | Baek | H01L 45/08 257/4 |
| 2013/0056700 A1* | 3/2013 | Wang | H01L 45/08 257/4 |
| 2013/0093023 A1* | 4/2013 | Yamada | H01L 27/0623 257/378 |
| 2014/0092668 A1 | 4/2014 | Kim et al. | |
| 2015/0028281 A1* | 1/2015 | Chen | H01L 45/1253 257/4 |
| 2015/0188039 A1 | 7/2015 | Wang et al. | |
| 2015/0188043 A1 | 7/2015 | Wang | |
| 2016/0064664 A1* | 3/2016 | Dang | H01L 45/1233 257/4 |

OTHER PUBLICATIONS

"Office Action of Taiwan Counterpart Application," issued on May 31, 2017, p1-p5, in which the listed reference was cited.

\* cited by examiner

*Primary Examiner* — Kimberly Rizkallah
*Assistant Examiner* — Brian Turner
(74) *Attorney, Agent, or Firm* — Jianq Chyun IP Office

(57) ABSTRACT

A resistive random access memory is provided. The resistive random access memory includes a bottom electrode, a top electrode, a resistance changeable layer, an oxygen reservoir layer and a reactive oxygen barrier layer. The bottom electrode is disposed on a substrate. The top electrode is disposed above the bottom electrode. The resistance changeable layer is disposed between the bottom electrode and the top electrode. The oxygen reservoir layer is disposed between the resistance changeable layer and the top electrode. The reactive oxygen barrier layer is disposed inside the oxygen reservoir layer.

18 Claims, 3 Drawing Sheets

RESISTIVE RANDOM ACCESS MEMORY

BACKGROUND

Field of the Invention

The invention is directed to a non-volatile memory and more particularly, to a resistive random access memory.

Description of Related Art

A resistive random access memory (RRAM) is a type of a non-volatile memory. The resistive random access memory having advantages, such as low writing operation voltage, short write and erase time, long retention time, non-destructive reading, multi-level capability, simple structure and small cell area, has a great application potential in future personal computers and electronic equipment and thus, is being widely developed.

Generally, a resistive random access memory is a metal-insulating layer-metal (MIM) structure composed of a top electrode, a bottom electrode and a resistance changeable layer therebetween.

When a positive bias is applied to the resistance changeable layer, oxygen ions are attracted by the positive bias to leave the resistance changeable layer, such that oxygen vacancy is generated, a filament structure is formed, and the filament structure is in a conductive states, and as a result, the resistance changeable layer is converted from a high-resistance state (HRS) to a low-resistance state (LRS). Typically, a titanium (Ti) layer is disposed between the top electrode and the resistance changeable layer to store oxygen ions leaving the resistance changeable layer due to the attraction of the positive bias.

When a negative bias is applied to the resistance changeable layer, the oxygen ions return to the resistance changeable layer, such that a conductive filament is broken and is in a non-conductive state, and the resistance changeable layer is converted from the LRS to the HRS. However, if the oxygen ions have diffused out in the Ti layer, an issue of incomplete reset operation will occur.

SUMMARY

The invention provides a resistive random access memory, in which a reactive oxygen barrier layer is disposed, such that reset characteristics and durability of a memory device can be enhanced, and a yield and stability of the memory device can be increased.

The invention provides a fabrication method of a resistive random access memory is provided, in which a reactive oxygen barrier layer is formed in an oxygen reservoir layer, so as to enhance reset characteristics and durability of a memory device and increase a yield and stability of the memory device.

According to an embodiment of the invention, a resistive random access memory including a bottom electrode, a top electrode, a resistance changeable layer, an oxygen reservoir layer and a reactive oxygen barrier layer is provided. The bottom electrode is disposed on the substrate. The top electrode is disposed above the bottom electrode. The resistance changeable layer is disposed between the bottom electrode and the top electrode. The oxygen reservoir layer is disposed between the resistance changeable layer and the top electrode. The reactive oxygen barrier layer is disposed in the oxygen reservoir layer.

In an embodiment of the invention, a material of the reactive oxygen barrier layer includes aluminum (Al) or titanium trialuminide ($TiAl_3$).

In an embodiment of the invention, a material of the oxygen reservoir layer includes titanium (Ti).

In an embodiment of the invention, a thickness of the reactive oxygen barrier layer ranges from 1 nm to 3 nm.

In an embodiment of the invention, a thickness of the oxygen reservoir layer ranges from 10 nm to 40 nm.

In an embodiment of the invention, a thickness of the oxygen reservoir layer between the reactive oxygen barrier layer and the resistance changeable layer ranges from 10 nm to 20 nm.

In an embodiment of the invention, the resistive random access memory further includes a barrier layer. The barrier layer is disposed between the oxygen reservoir layer and the resistance changeable layer.

In an embodiment of the invention, a material of the barrier layer includes aluminum oxide ($Al_2O_3$).

In an embodiment of the invention, a material of the oxygen reservoir layer includes Ti, and a material of the reactive oxygen barrier layer includes Al or $TiAl_3$.

In an embodiment of the invention, a material of the resistance changeable layer includes a transition metal oxide.

According to an embodiment of the invention, a fabrication method of a resistive random access memory is provided. The fabrication method includes the following steps. A substrate is provided. A bottom electrode is formed on the substrate. A resistance changeable layer is formed on the bottom electrode. A first oxygen reservoir layer is formed on the resistance changeable layer. A reactive oxygen barrier layer is formed on the first oxygen reservoir layer. A second oxygen reservoir layer is formed on the reactive oxygen barrier layer. A top electrode is formed on the second oxygen reservoir layer.

In an embodiment of the invention, the fabrication method further includes an annealing process after the step of forming the reactive oxygen barrier layer on the first oxygen reservoir layer.

In an embodiment of the invention, a temperature of the annealing process ranges from 300° C. to 450° C.

In an embodiment of the invention, a material of the reactive oxygen barrier layer includes Al or $TiAl_3$.

In an embodiment of the invention, a material of the oxygen reservoir layer includes Ti.

In an embodiment of the invention, a thickness of the reactive oxygen barrier layer ranges from 1 nm to 3 nm.

In an embodiment of the invention, a thickness of the oxygen reservoir layer ranges from 10 nm to 40 nm.

In an embodiment of the invention, a thickness of the oxygen reservoir layer between the reactive oxygen barrier layer and the resistance changeable layer ranges from 10 nm to 20 nm.

In an embodiment of the invention, the fabrication method of the resistive random access memory further includes forming a barrier layer between the oxygen reservoir layer and the resistance changeable layer.

In an embodiment of the invention, a material of the barrier layer includes $Al_2O_3$.

To sum up, in the resistive random access memory and the fabrication method thereof provided by the invention, the reactive oxygen barrier layer is formed in the oxygen reservoir layer, and when a positive bias is applied to the resistance changeable layer, oxygen ions are instantly removed from the oxygen reservoir layer (Ti) adjacent to a filament structure by the reactive oxygen barrier layer, and thereby, a concentration of the oxygen ions can be reduced. And, during the oxygen ions being removed, the reactive oxygen barrier layer reacts with the oxygen ions to form an oxide (e.g., $Al_2O_3$) interface layer, such that the oxygen ions can be prevented from diffusing out to the oxygen reservoir layer to depart away from the filament structure. In this way, the return of the oxygen ions can be ensured during a reset operation, so as to improve the durability.

Meanwhile, by means of controlling the temperature of the annealing process, Al (of the reactive oxygen barrier layer) reacts with Ti (of the oxygen reservoir layer) to form $TiAl_3$, and $TiAl_3$, which can facilitate removing the oxygen and preventing the oxygen from diffusing out to the oxygen reservoir layer to depart away from the filament structure in a more effective and excellent way.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
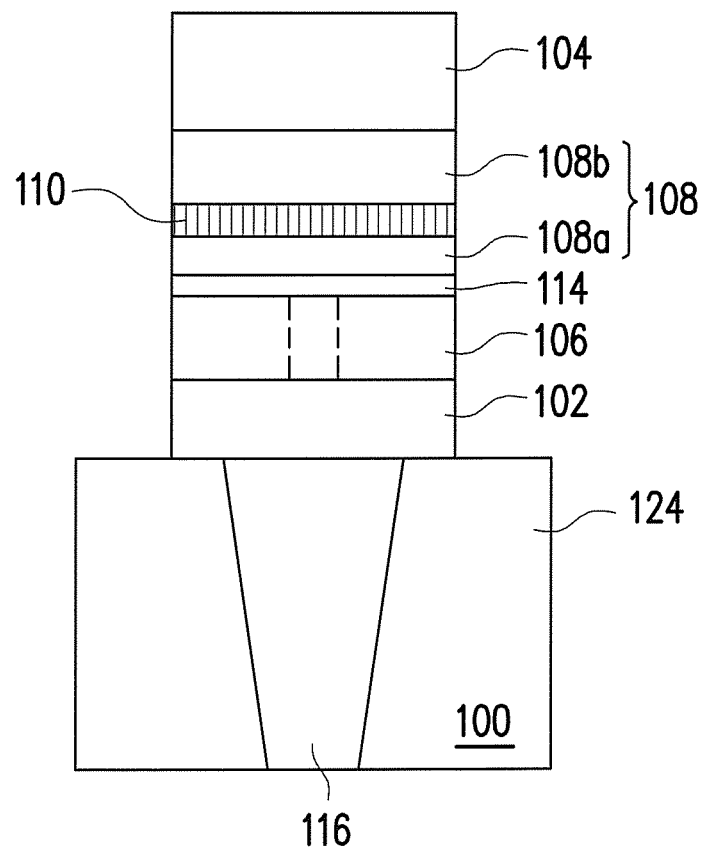
FIG. 1 is a cross-sectional view illustrating a resistive random access memory according to an embodiment of the invention.

The present invention is illustrated in detail with reference to the following drawings which show embodiments of the present invention. However, the present invention can further be implemented in various manners and should not be limited to the embodiments hereinafter. In practice, the embodiments are provided merely to disclose the present invention more detailed and complete, and to transfer the scope of the present invention to those of ordinary skill in the art completely.

For the sake for clarity, sizes and relative sizes of each layer shown in the drawings may be exaggerated.

FIG. 1 is a cross-sectional view illustrating a resistive random access memory according to an embodiment of the invention.

Referring to FIG. 1, a resistive random access memory includes a bottom electrode 102, a top electrode 104, a resistance changeable layer 106, an oxygen reservoir layer 108 and a reactive oxygen barrier layer 110.

The bottom electrode 102 is disposed on the substrate 100. A material of the bottom electrode 102 includes, for example, titanium nitride (TiN) or indium tin oxide (ITO). The bottom electrode 102 is electrically connected with a drain region in a transistor (not shown) through a plug 116. The plug 116 is disposed in an interlayered insulating layer 124, and the bottom electrode 102 is disposed on the interlayered insulating layer 124.

The top electrode 104 is disposed above the bottom electrode 102. A material of the top electrode 104 includes a conductive material, such as TiN or ITO.

The resistance changeable layer 106 is disposed between the bottom electrode 102 and the top electrode 104. A material of the resistance changeable layer 106 includes, for example, transition metal oxide, such as hafnium oxide ($HfO_2$), tantalum oxide ($Ta_2O_5$) or other suitable metal oxides. The resistance changeable layer 106 may have the following characteristics: when a positive bias is applied to the resistance changeable layer 106, oxygen ions are attracted by the positive bias to leave the resistance changeable layer 106, such that oxygen vacancy is generated, a filament structure is formed, and the filament structure is in a conductive state, and as a result, the resistance changeable layer 106 is converted from a high-resistance state (HRS) to a low-resistance state (LRS); when a negative bias is applied to the resistance changeable layer 106, the oxygen ions return to the resistance changeable layer 106, such that the conductive filament is broken and is in a non-conductive state, and the resistance changeable layer 106 is converted from the LRS to the HRS.

The oxygen reservoir layer 108 is disposed between the resistance changeable layer 106 and the top electrode 104. A material of the oxygen reservoir layer 108 includes, for example, titanium (Ti). A thickness of the oxygen reservoir layer 108 ranges from 10 nm to 40 nm.

The reactive oxygen barrier layer 110 is at least disposed in the oxygen reservoir layer 108. A material of the reactive oxygen barrier layer 110 (i.e., an oxygen supply layer) includes one which contains no oxygen, is capable of reacting with oxygen and being slightly oxidized to trap part of the oxygen and has a reactivity slightly stronger than aluminum oxide ($Al_2O_3$), such as aluminum (Al) or titanium trialuminide ($TiAl_3$). A thickness of the reactive oxygen barrier layer 110 ranges from 1 nm to 3 nm. In an embodiment, the oxygen reservoir layer 108 is divided into an oxygen reservoir layer 108a and an oxygen reservoir layer 108b by the reactive oxygen barrier layer 110. A thickness of the oxygen reservoir layer 108a between the reactive oxygen barrier layer 110 and the resistance changeable layer 106 ranges from 10 nm to 20 nm. The reactive oxygen barrier layer 110 reacts with the oxygen to form an oxide (e.g., $Al_2O_3$) interface layer for limiting oxygen from diffusing deeper into the oxygen reservoir layer 108b.

A barrier layer 114 may further selectively disposed between the oxygen reservoir layer 108 and the resistance changeable layer 106. A material of the barrier layer 114 includes $Al_2O_3$.

In the present embodiment, when the positive bias is applied to the resistance changeable layer 106, the oxygen ions are attracted by the positive bias to leave the resistance changeable layer 106 and enter the oxygen reservoir layer 108, instantly removed from oxygen reservoir layer 108 (including Ti) adjacent to a filament structure 126 by the reactive oxygen barrier layer 110, and thereby, a concentration of the oxygen ions is reduced. Meanwhile, during the oxygen ions being removed, the reactive oxygen barrier layer 110 reacts with the oxygen ions to form an oxide (e.g., $Al_2O_3$) interface layer to prevent the oxygen from diffusing out to the oxygen reservoir layer 108b to depart away from the filament structure 126, i.e., the oxygen ions are limited in an range of the oxygen reservoir layer 108a. In this way, the oxygen ions may return to the resistance changeable layer 106 more easily in a reset operation, so as to improve reset characteristics and durability.

Figure 2A:
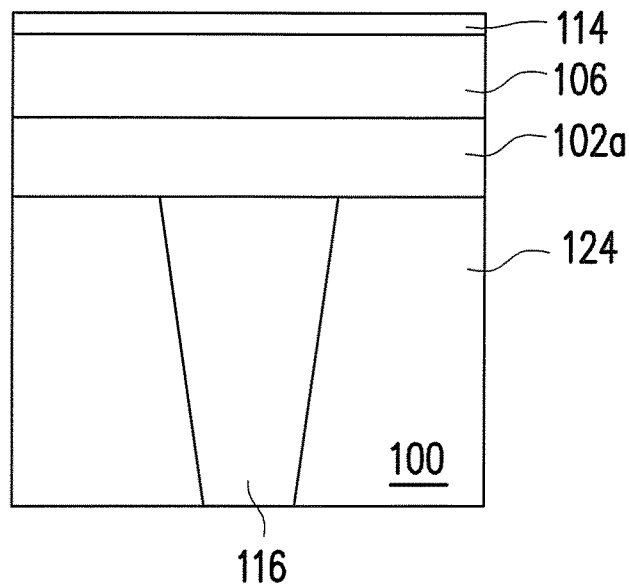
FIG. 2A through FIG. 2C are cross-sectional views illustrating a fabricating process of a resistive random access memory according to an embodiment of the invention.
Figure 2B:
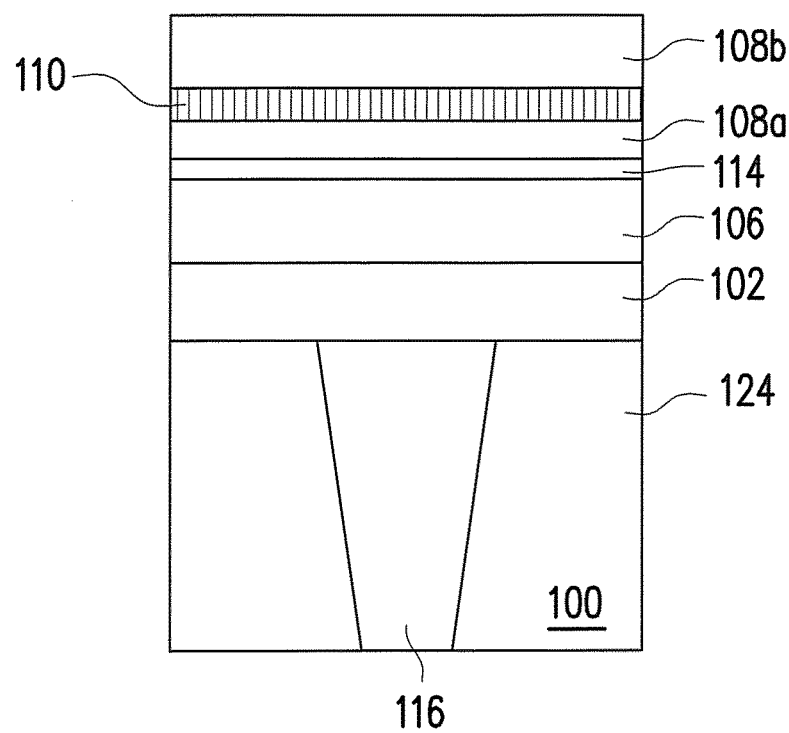
Figure 2C:
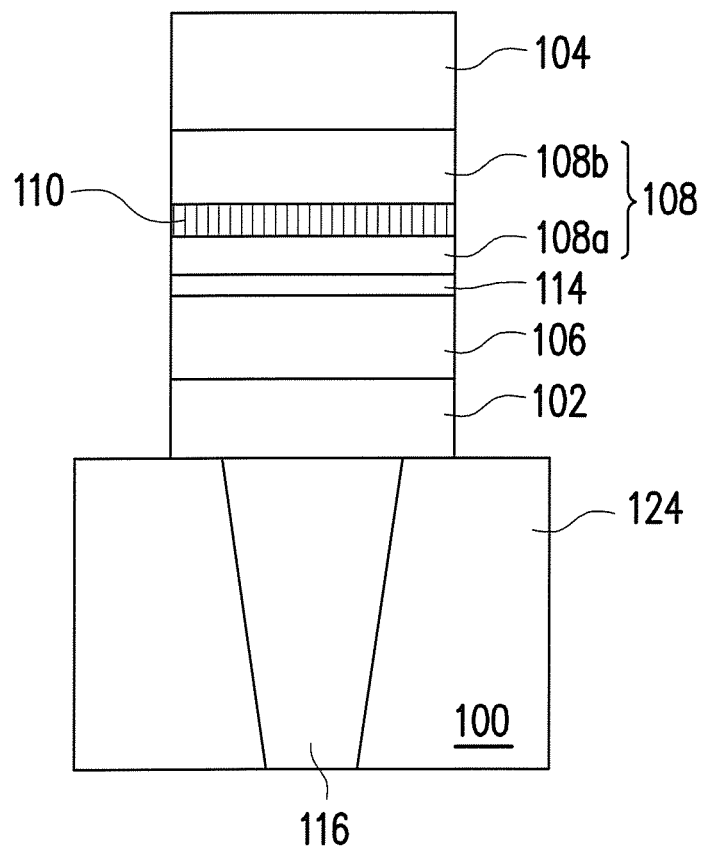

FIG. 2A through FIG. 2C are cross-sectional views illustrating a fabricating process of a resistive random access memory according to an embodiment of the invention. In FIG. 2A to FIG. 2C, elements same as those illustrated in FIG. 1 are given the same reference numerals, and the material and characteristics of each layer that will be described hereinafter if not being described in more detail are considered as the same as those illustrated in FIG. 1.

Referring to FIG. 2A, a bottom electrode layer 102a is formed on a substrate 100. The substrate 100 is, for example, a dielectric substrate. The substrate 100 is not particularly limited in the present embodiment. For example, the substrate 100 may be, for example, composed of a silicon substrate and an interlayered insulating layer 124 located on the silicon substrate. Additionally a semiconductor element may be provided on the silicon substrate, and a plug 116 may be provided in the interlayered insulating layer 124. A material of the bottom electrode layer 102a includes, for example, TiN or ITO. A method for forming the bottom electrode layer 102a is, for example, a physical vapor deposition (PVD) method or an atomic layer deposition (ALD) method.

Then, a resistance changeable layer 106 is formed on the bottom electrode layer 102a. A material of the resistance changeable layer 106 includes a transition metal oxide, such as $HfO_2$, $Ta_2O_5$ or other suitable metal oxides. A method for forming the resistance changeable layer 106 is, for example, a PVD method or an ALD method.

Then, a barrier layer 114 is selectively formed on the resistance changeable layer 106. A material of the barrier layer 114 includes $Al_2O_3$. A method for forming the barrier layer 114 is, for example, a PVD method or an ALD method.

Referring to FIG. 2B, an oxygen reservoir layer 108a is formed above the resistance changeable layer 106. A material of the oxygen reservoir layer 108a includes, for example, Ti. A thickness of the oxygen reservoir layer 108a ranges from 10 nm to 40 nm. A method for forming the oxygen reservoir layer 108a is, for example, a PVD method or an ALD method.

A reactive oxygen barrier layer 110 is formed on the oxygen reservoir layer 108a. A material of the reactive oxygen barrier layer 110 (i.e., an oxygen supply layer) includes one which contains no oxygen, is capable of reacting with oxygen and being slightly oxidized to trap part of the oxygen and has a reactivity slightly stronger than $Al_2O_3$, such as Al or titanium $TiAl_3$. A thickness of the reactive oxygen barrier layer 110 ranges from 1 nm to 3 nm. In an embodiment, a material of the reactive oxygen barrier layer 110 includes Al, and a forming method thereof is, for example, a PVD method or an ALD method.

In an embodiment, the reactive oxygen barrier layer 110 includes $TiAl_3$, and the forming method thereof further includes performing an annealing process after the reactive oxygen barrier layer (i.e., the Al layer) is formed on the oxygen reservoir layer 108a, such that Al (i.e., the reactive oxygen barrier layer 110) reacts with Ti (i.e., the oxygen reservoir layer 108a) to form $TiAl_3$. A temperature of the annealing process ranges from 300° C. to 450° C.

An oxygen reservoir layer 108b is formed on the reactive oxygen barrier layer 110. A material of the oxygen reservoir layer 108b includes, for example, Ti. A thickness of the oxygen reservoir layer 108b from 10 nm to 40 nm. A method for forming the oxygen reservoir layer 108b is, for example, a PVD method or an ALD method.

Referring to FIG. 2C, a top electrode layer (not shown) is formed on the oxygen reservoir layer 108b. A material of the top electrode layer includes a conductive material, such as TiN or ITO. A method for forming the top electrode layer is, for example, a PVD method or an ALD method.

Thereafter, the top electrode layer, the oxygen reservoir layer 108b, the reactive oxygen barrier layer 110, the oxygen reservoir layer 108a, the barrier layer 114, the resistance changeable layer 106, the bottom electrode layer 102a are patterned to form a resistive random access memory. The resistive random access memory includes the top electrode 104, the oxygen reservoir layer 108b, the reactive oxygen barrier layer 110, the oxygen reservoir layer 108a, the barrier layer 114, the resistance changeable layer 106 and the bottom electrode 102.

In an embodiment, the annealing process may also be performed after a stacked layer of the bottom electrode layer 102a, the resistance changeable layer 106, the oxygen reservoir layer 108, the reactive oxygen barrier layer 110, the barrier layer 114, the top electrode layer 104a is completed.

In the present embodiment, the reactive oxygen barrier layer 110 is formed in the oxygen reservoir layer 108. During the oxygen ions being removed, the reactive oxygen barrier layer 110 reacts with the oxygen to form an oxide (e.g., $Al_2O_3$) interface layer to prevent the oxygen ions from diffusing out to the oxygen reservoir layer 108b to depart away from the filament structure 126, i.e., the oxygen ions are limited in a range of the oxygen reservoir layer 108a. Thus, in a reset operation, the oxygen ions may return to the resistance changeable layer 106 more easily, so as to improve the reset characteristics and the durability.

Meanwhile, by means of controlling the temperature of the annealing process, Al (i.e., the reactive oxygen barrier layer 110) reacts with Ti (i.e., the oxygen reservoir layer 108a) to form $TiAl_3$. $TiAl_3$ facilitates preventing the oxygen ions from diffusing out to the oxygen reservoir layer 108b to depart away from the filament structure 126 in a more effective and excellent way.

To summarize, in the resistive random access memory and the fabrication method thereof provided by the invention, the reactive oxygen barrier layer can facilitate the improvement of the high-temperature data retention, the reset characteristics and the durability of the memory device, as well as the increase of the yield and the stability of the memory device.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A resistive random access memory, comprising:
   a bottom electrode, disposed on a substrate;
   a top electrode, disposed above the bottom electrode;
   a resistance changeable layer, disposed between the bottom electrode and the top electrode;
   an oxygen reservoir layer, disposed between the resistance changeable layer and the top electrode;
   a barrier layer disposed between the oxygen reservoir layer and the resistance changeable layer; and
   a reactive oxygen barrier layer, disposed in the oxygen reservoir layer, wherein the reactive oxygen barrier layer has a reactivity stronger than aluminum oxide.

2. The resistive random access memory according to claim 1, wherein a material of the reactive oxygen barrier layer comprises aluminum (Al) or titanium trialuminide ($TiAl_3$).

3. The resistive random access memory according to claim 1, wherein a material of the oxygen reservoir layer comprises titanium (Ti).

4. The resistive random access memory according to claim 1, wherein a thickness of the reactive oxygen barrier layer ranges from 1 nm to 3 nm.

5. The resistive random access memory according to claim 1, wherein a thickness of the oxygen reservoir layer ranges from 10 nm to 40 nm.

6. The resistive random access memory according to claim 1,
wherein a thickness of the oxygen reservoir layer between the reactive oxygen barrier layer and the resistance changeable layer ranges from 10 nm to 20 nm.

7. The resistive random access memory according to claim 1, wherein a material of the barrier layer comprises aluminum oxide ($Al_2O_3$).

8. The resistive random access memory according to claim 1, wherein a material of the oxygen reservoir layer comprises Ti, and a material of the reactive oxygen barrier layer comprises Al or $TiAl_3$.

9. The resistive random access memory according to claim 1, wherein a material of the resistance changeable layer comprises a transition metal oxide.

10. A fabrication method of a resistive random access memory, comprising:
providing a substrate;
forming a bottom electrode on the substrate;
forming a resistance changeable layer on the bottom electrode;
forming a barrier layer on the resistance changeable layer;
forming a first oxygen reservoir layer on the barrier layer and the resistance changeable layer, so that the barrier layer is located in between the first oxygen reservoir layer and the resistance changeable layer;
forming a reactive oxygen barrier layer on the first oxygen reservoir layer, wherein the reactive oxygen barrier layer has a reactivity stronger than aluminum oxide;
forming a second oxygen reservoir layer on the reactive oxygen barrier layer; and
forming a top electrode on the second oxygen reservoir layer.

11. The fabrication method according to claim 10, further comprising an annealing process after the step of forming the reactive oxygen barrier layer on the first oxygen reservoir layer.

12. The fabrication method according to claim 11, wherein a temperature of the annealing process ranges from 300° C. to 450° C.

13. The fabrication method according to claim 10, wherein a material of the reactive oxygen barrier layer comprises Al or $TiAl_3$.

14. The fabrication method according to claim 10, wherein a material of the oxygen reservoir layer comprises Ti.

15. The fabrication method according to claim 10, wherein a thickness of the reactive oxygen barrier layer ranges from 1 nm to 3 nm.

16. The fabrication method according to claim 10, wherein a thickness of the oxygen reservoir layer ranges from 10 nm to 40 nm.

17. The fabrication method according to claim 10, wherein a thickness of the oxygen reservoir layer between the reactive oxygen barrier layer and the resistance changeable layer ranges from 10 nm to 20 nm.

18. The fabrication method according to claim 10, wherein a material of the barrier layer comprises $Al_2O_3$.

* * * * *